(12) United States Patent
Chou et al.

(10) Patent No.: US 8,456,844 B2
(45) Date of Patent: Jun. 4, 2013

(54) ADJUSTABLE MOUNT ASSEMBLY

(75) Inventors: Ten-Zen Chou, Xindian (TW); Fwu Bin Hsu, Taipei (TW); Yao Yih Wang, Sijhih (TW)

(73) Assignee: International Business Machines Corporation, Armonk, NY (US)

( * ) Notice: Subject to any disclaimer, the term of this patent is extended or adjusted under 35 U.S.C. 154(b) by 250 days.

(21) Appl. No.: 12/826,682

(22) Filed: Jun. 30, 2010

(65) Prior Publication Data

US 2010/0328872 A1 Dec. 30, 2010

(30) Foreign Application Priority Data

Jun. 30, 2009 (TW) ................................ 98122054 A

(51) Int. Cl.
*H05K 5/00* (2006.01)
*H05K 7/00* (2006.01)

(52) U.S. Cl.
USPC ....... 361/727; 361/679.08; 361/724; 361/725

(58) Field of Classification Search
USPC .............................. 361/679.08, 724, 725, 727
See application file for complete search history.

(56) References Cited

U.S. PATENT DOCUMENTS

| | | | |
|---|---|---|---|
| 5,173,686 A | 12/1992 | Fujihara | |
| 6,185,092 B1 * | 2/2001 | Landrum et al. | 361/679.11 |
| 6,442,030 B1 | 8/2002 | Mammoser | |
| 6,585,203 B1 | 7/2003 | Euker | |
| 6,778,381 B1 | 8/2004 | Bolognia | |
| 6,945,412 B2 | 9/2005 | Felcman et al. | |
| 7,019,963 B2 * | 3/2006 | Lee et al. | 361/679.06 |
| 7,256,986 B2 * | 8/2007 | Williams et al. | 361/679.55 |
| 7,405,926 B2 | 7/2008 | Wu | |
| 7,464,909 B2 | 12/2008 | Li | |
| 7,633,760 B2 * | 12/2009 | Wu et al. | 361/727 |
| 2005/0168499 A1 * | 8/2005 | Williams et al. | 345/905 |
| 2005/0168926 A1 | 8/2005 | Lee | |
| 2005/0174724 A1 | 8/2005 | Chen | |
| 2005/0225217 A1 * | 10/2005 | Nay et al. | 312/208.1 |
| 2006/0244700 A1 * | 11/2006 | Sano et al. | 345/87 |
| 2008/0068788 A1 * | 3/2008 | Ozawa et al. | 361/686 |

FOREIGN PATENT DOCUMENTS

EP 1515597 3/2005

OTHER PUBLICATIONS

Server Rack Ordering Guide—Server Rack Information, http://www.server-rack-online.com/server-rack-information.html.

* cited by examiner

*Primary Examiner* — Anthony Haughton
(74) *Attorney, Agent, or Firm* — The Steadman Law Firm PLLC; Thomas E. Tyson

(57) ABSTRACT

An adjustable mount assembly and a related rack mount system are provided. The adjustable mount assembly is adapted for mounting a user interaction device outward from a cabinet structure comprising a first surface and a second surface adjacent to the first surface. The adjustable mount assembly comprises a moving member movable substantially horizontally with respect to the first surface. The adjustable mount assembly further comprises an adjustable frame member coupled to the moving member for mounting the user interaction device, wherein a length of the adjustable frame member is adjustable with respect to the second surface. In accordance with an embodiment, the adjustable frame member comprises a two-fold sliding track, wherein the two-fold sliding track comprises a first fold slidably mounted on the first surface and a second fold fixedly holding the user interaction device.

20 Claims, 4 Drawing Sheets

ADJUSTABLE MOUNT ASSEMBLY

RELATED APPLICATION

This application claims priority under 35 U.S.C.§119 to Taiwanese Patent Application No. 98122054 filed Jun. 30, 2009, the entire text of which is specifically incorporated by reference herein.

FIELD OF THE INVENTION

The various embodiments described herein relate generally to mount systems and more particularly to rack mount systems and adjustable mount assemblies.

BACKGROUND

In high capacity systems, rack mount systems are often used. The rack mount systems typically comprise vertically elongated cabinet structures. A cabinet structure typically comprises an internal rectangular frame structure extending vertically upward from the floor and externally covered by panels. Further, the sides of the frame structure are provided with openings and/or apertures for receiving screws and the like, so that a plurality of electronic/electrical units may be mounted in the frame structure. The units are vertically stacked closely to one another for the purpose of conserving space. Usually, a user interaction device (e.g., a monitor, a keyboard, a combination thereof, etc.) is used to facilitate communication between the user and the electronic/electrical units.

With the rapid development of the Internet and other new information technologies, servers are widely used. In fact, a significant number of servers are indispensable in various enterprises. The allocation of the servers in rack mount systems is an important issue in terms of stability.

For example, standard Electronic Industries Alliance (EIA) rack mount systems, in compliance with EIA specifications, are common in the market. The EIA rack mount systems are configured to contain electronic/electrical units with a "rack unit" or "U" standard. Each of the electronic/electrical units manufactured in compliance with EIA specifications has a height of 1U, 2U, or multiple U, wherein each U is approximately 1.75 inch. The electronic/electrical units thus can be placed within the rack mount system in a modular fashion such that various combinations of electronic/electrical units can be integrated into a single system. Each server in the rack mount system is self-contained and operates independently. Usually the servers are mounted in a server drawer structure slidably supported in the internal rectangular frame structure of the cabinet structure for movement and thus for replacement.

In conventional rack mount systems, if a flat panel display is used as a monitor, one 1U of space usually is reserved in the cabinet structure to contain a bracket holding the flat panel display, and the bracket can be horizontally slidable. For example, the bracket has a first frame extending out of the cabinet structure, and the first frame is pivotally mounted to a second frame, with a keyboard and a flat panel display at the opposite end of the second frame. In a planar configuration, the bracket with the keyboard and the display can be stored in the cabinet structure. After being withdrawn from the cabinet structure, the flat panel display attached to the bracket can be angularly rotated or pivoted for viewing and use.

However, in accordance with conventional systems, one 1U of space is to be reserved to contain the bracket with the flat panel display, and thus an issue may arise with respect to space allocation efficiency. Further, the first frame of the bracket usually is attached to the middle portion of the frame structure extending vertically upward from the floor. After the bracket is withdrawn from the cabinet structure, the display only can be angularly rotated for viewing and use. If the display is to be used in other locations, such as a location near the top of the cabinet structure or a position near the bottom of the cabinet structure, the viewing experience may not be satisfactory.

SUMMARY

In accordance with a first aspect of the various embodiments described herein, a mount assembly is provided for mounting a user interaction device outward from a cabinet structure. The cabinet structure may comprise a first surface and a second surface adjacent to the first surface. The mount assembly may comprise a moving member movable substantially horizontally with respect to the first surface and an adjustable frame member for mounting the user interaction device. The adjustable frame member is coupled to the moving member, and a length of the adjustable frame member is adjustable substantially with respect to the second surface.

The first surface comprises a top surface of the cabinet structure, and the second surface comprises a front surface adjacent to the top surface. The cabinet structure is adapted for receiving at least one unit. The at least one unit comprises at least one of a desktop computer, a notebook computer, a server, an article of medical equipment, a high level power supply, and an enterprise level storage system.

The user interaction device of the mount assembly comprises at least one of a monitor, a keyboard, and a mouse. The monitor comprises at least one of a flat display panel, a cathode ray tube display, and a projection display. The keyboard comprises at least one of a physical keyboard, a virtual keyboard, and a MIDI keyboard.

Moreover, the adjustable frame member of the mount assembly may comprise a two-fold sliding track. The two-fold sliding track may comprise a first fold slidably mounted on the first surface and a second fold fixedly holding the user interaction device.

The mount assembly further may comprise a support member fixedly mounted on the first surface of the cabinet structure. The moving member is slidably mounted on the support member. The mount assembly further may comprise a ball bearing member retained in the support member for coordinating the motion of the user interaction device in response to the moving member being moved on the first surface. The mount assembly further may comprise a handle member mounted on the user interaction device. By exerting a first force on the handle member, the moving member slides along the support member. By exerting a second force on the handle member, the user interaction device is pivoted to a position parallel to the second surface via the moving member. By exerting a third force on the handle member, the length of the adjustable frame member is adjusted commensurate with the third force.

Furthermore, the support member may comprise a pair of frames with a pair of slots and a pair of notches respectively at ends of the pair of slots. The moving member comprises a pair of wheels for sliding within the pair of slots, wherein the pair of wheels are pivotally attached to the pair of frames in response to the pair of wheels being engaged with the pair of notches. Additionally, the length of the adjustable frame member is adjustable in response to the adjustable frame member being pivoted to a position parallel to the second surface.

Moreover, the adjustable frame member may comprise a pair of first frames and a pair of second frames respectively adjustably coupled to the pair of first frames. The pair of first frames are respectively coupled to the pair of wheels, and the user interaction device is coupled to the pair of second frames.

In accordance with a second aspect of the various embodiments described herein, a rack mount system is provided. The rack mount system may comprise a user interaction device. The rack mount system further may comprise a cabinet structure adapted for receiving at least one equipment, wherein the cabinet structure comprises a first surface and a second surface adjacent to the first surface. The rack mount system further may comprise a support member fixedly mounted on the first surface of the cabinet structure. The rack mount system further may comprise a moving member slidably mounted on the support member. The moving member is pivotally connected to one end of the support member in response to the moving member being moved to a position corresponding to the one end of the support member. In addition, the moving member is pivoted to a position substantially parallel to the second surface in response to the moving member being pivotally connected to the one end of the support member. The rack mount system further may comprise an adjustable frame member for mounting the user interaction device. The adjustable frame member is coupled to the moving member, and a length of the adjustable frame member is adjustable in response to the moving member being pivoted to a position substantially parallel to the second surface.

In accordance with a third aspect of the various embodiments described herein, a mount assembly for a vertically elongated, rectangularly configured structure is provided. The structure may comprise a first surface and a second surface adjacent to the first surface. The mount assembly may comprise a support member fixedly mounted on the first surface of the structure. The mount assembly further may comprise a moving member slidably mounted on the support member. The moving member is pivotally connected to one end of the support member in response to the moving member being moved to a position corresponding to the one end of the support member, and the moving member is pivoted to a position substantially parallel to the second surface in response to the moving member being pivotally connected to the one end of the support member. The mount assembly further may comprise an adjustable frame member coupled to the moving member, wherein a length of the adjustable frame member is adjustable in response to the moving member being pivoted to a position substantially parallel to the second surface.

The structure of the mount assembly may comprise four vertical supports defining a top surface and a front surface. The first surface comprises the top surface, and the second surface comprises the front surface.

The described features, advantages, and characteristics of the various embodiments may be combined in any suitable manner in one or more embodiments. One skilled in the relevant art will recognize that the various embodiments may be practiced without one or more of the specific features or advantages of a particular embodiment. In other instances, additional features and advantages may be recognized in certain embodiments among the various embodiments that may not be present in all of the various embodiments.

BRIEF DESCRIPTION OF THE DRAWINGS

In order that the advantages of the various embodiments will be readily understood, a more particular description of the various embodiments briefly described above will be provided by reference to specific exemplary embodiments that are illustrated in the accompanying drawings, which depict only exemplary embodiments and are not to be considered to be limiting in scope. The various embodiments are to be described and explained with additional specificity and detail through the use of the accompanying drawings, in which.

DETAILED DESCRIPTION

Reference throughout this specification to "an exemplary embodiment," or similar language signifies that a particular feature, structure, or characteristic described in connection with the exemplary embodiment is included in at least one embodiment.

Figure 1:
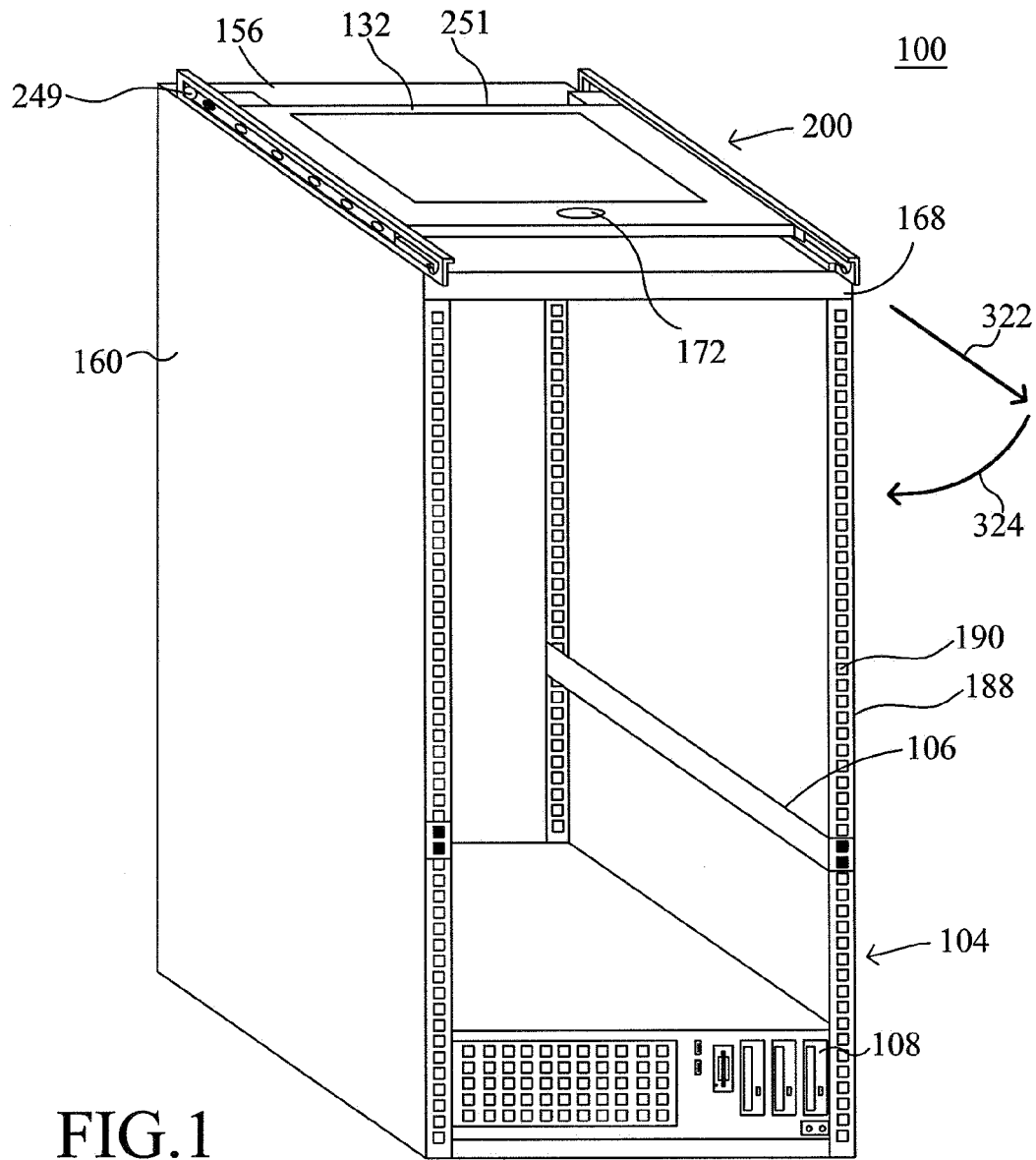
FIG. 1 shows a rack mount system in accordance with an exemplary embodiment.

FIG. 1 shows a rack mount system 100 in accordance with an exemplary embodiment. The rack mount system 100 may comprise a user interaction device 132, a cabinet structure 104, and an adjustable mount assembly 200. The user interaction device 132 is attached to the adjustable mount assembly 200. In accordance with an exemplary embodiment, the user interaction device 132 may be attached to the adjustable mount assembly 200 via a frame 251. By the operation of the adjustable mount assembly 200, the user interaction device 132 may be movable outward from the cabinet structure 104. Details of the structures and operations thereof are further described herein. The cabinet structure 104, for example, may be a vertically elongated, rectangularly configured cabinet structure that may be supported on a floor via pad members (not shown) depending from bottom side corners of the cabinet structure 104. The cabinet structure 104 may have a horizontal width and depth conforming to Electronic Industries Alliance (EIA) specifications.

Additionally, according to an exemplary embodiment, the cabinet structure 104 may comprise a rectangularly configured structure having four vertical supports 188 (two in the front and two in the back), each support 188 having a plurality of holes 190 (e.g., rectangular holes) formed along its length. Horizontal rails 106, which are used to support each individual electronic/electrical unit 108 to be mounted in the rack mount system 100, are attached to the vertical supports 188 via cage nuts (not shown) that are passed through the plurality of holes 190 in the supports 188. Side walls may be attached to the sides of the rectangularly configured structure (e.g., a left side wall 160 in FIG. 1). A top wall may be attached to the top of the rectangularly configured structure, and the top wall defines a first surface (i.e., top surface) 156. A bottom wall may be attached to the bottom of the rectangularly configured structure. A front opening and a rear opening also are shown in FIG. 1. A front opening door optionally may be provided, and a rear opening door optionally may be provided. The front opening defines a second surface 168, and the second surface 168 is adjacent to the first surface 156. Thus, a complete enclosure for the cabinet structure 104 is provided.

An electronic/electrical unit 108 supported by the horizontal rails 106 may be a desktop computer, a notebook computer, a server, an article of medical equipment, a high level power supply, an enterprise level storage system, or a combination thereof. In accordance with an exemplary embodiment, a plurality of pairs of horizontal rails 106 define space for receiving a plurality of units. The user interaction device 132 may be a monitor, a keyboard, a mouse, or a combination thereof. The monitor may be a flat display panel, a cathode ray tube display, a projection display, or a combination thereof. The keyboard may be a physical keyboard, a virtual keyboard, a MIDI keyboard, or a combination thereof.

Figure 2:
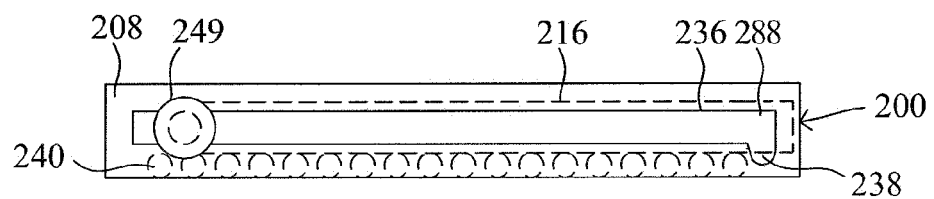
FIG. 2 shows a side view of an adjustable mount assembly in accordance with an exemplary embodiment.

FIG. 2 shows a side view of the adjustable mount assembly 200 in accordance with an exemplary embodiment. The adjustable mount assembly 200 may comprise a support member 208 fixedly mounted on the first surface 156 of the cabinet structure 104. The adjustable mount assembly 200 further may comprise a moving member 249 arranged on the support member 208 and movable horizontally with respect to the first surface 156 of the cabinet structure 104. The moving member 249 is pivotally attached to one end 288 of the support member 208 after the moving member 249 is moved to a predetermined position corresponding to the one end 288 of the support member 208.

According to an exemplary embodiment, the support member 208 may comprise a pair of frames with a pair of slots 236 and a pair of notches 238. A plurality of ball bearings 240 are retained in the support member 208. The plurality of ball bearings 240 may, e.g., be implemented via conventional ball bearings technology. The plurality of ball bearings 240 are movably held in the pair of frames of the support member 208. The moving member 249 may comprise a wheel-axis member, e.g., including a pair of wheels, wherein the wheel-axis member may have, e.g., a dumbbell shape. The pair of wheels of the moving member 249 cooperatively work with (slide within) the pair of slots 236, and thus the pair of wheels of the moving member 249 are slidably engaged with the pair of frames of the support member 208. Specifically, the pair of wheels are engaged with the pair of notches 238 of the pair of frames. The relative sliding movement of the support member 208 and the moving member 249 is achieved by the arrangement of the pair of wheels of the moving member 249 and the pair of slots 236 according to this embodiment, such that the moving member 249 can slide within and out of the top wall area of the cabinet structure 104. The relative sliding may, e.g., be implemented via conventional sliding apparatus technology.

Figure 3:
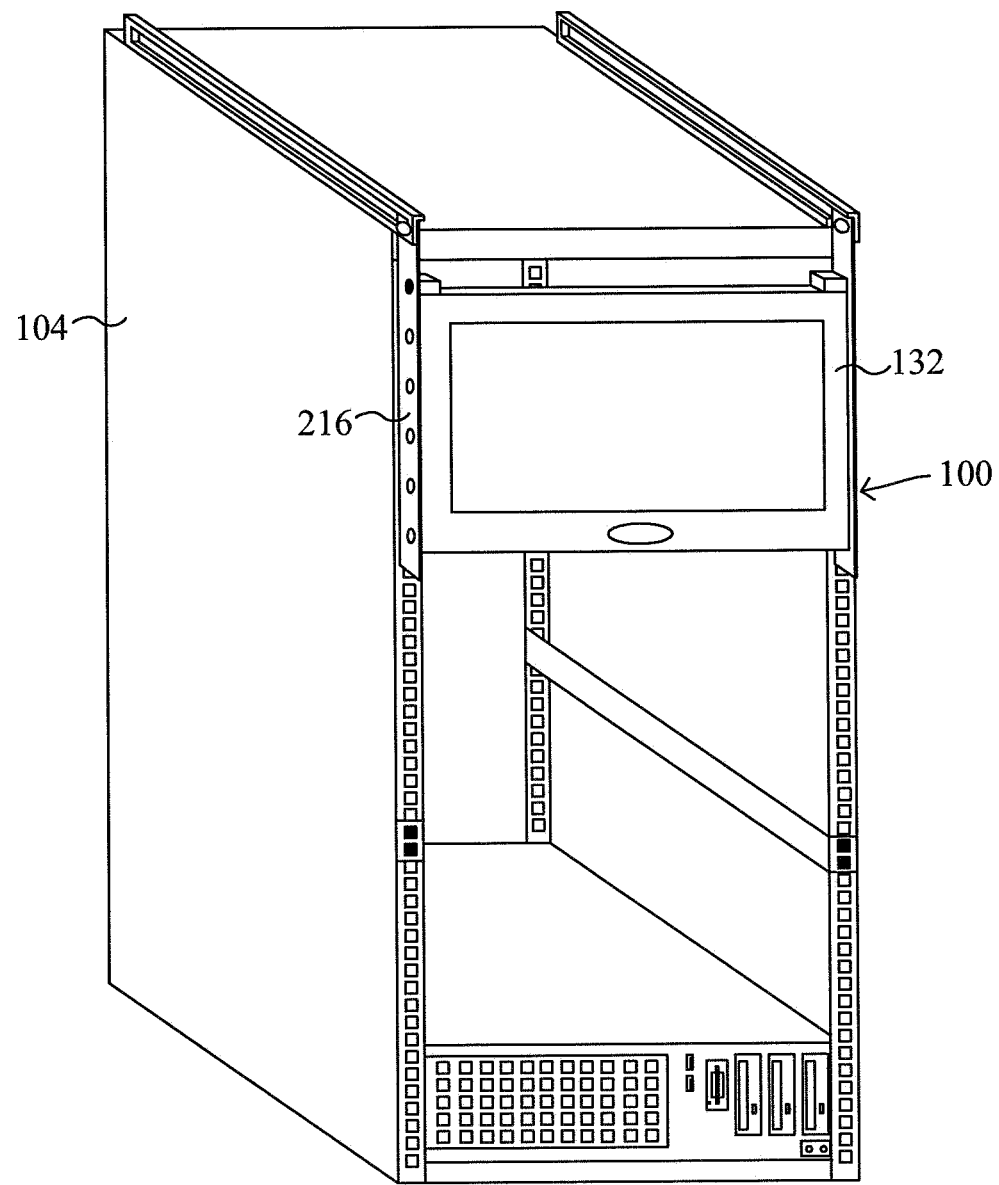
FIG. 3 shows a positional arrangement of the user interaction device in the rack mount system in accordance with an exemplary embodiment.
Figure 4:
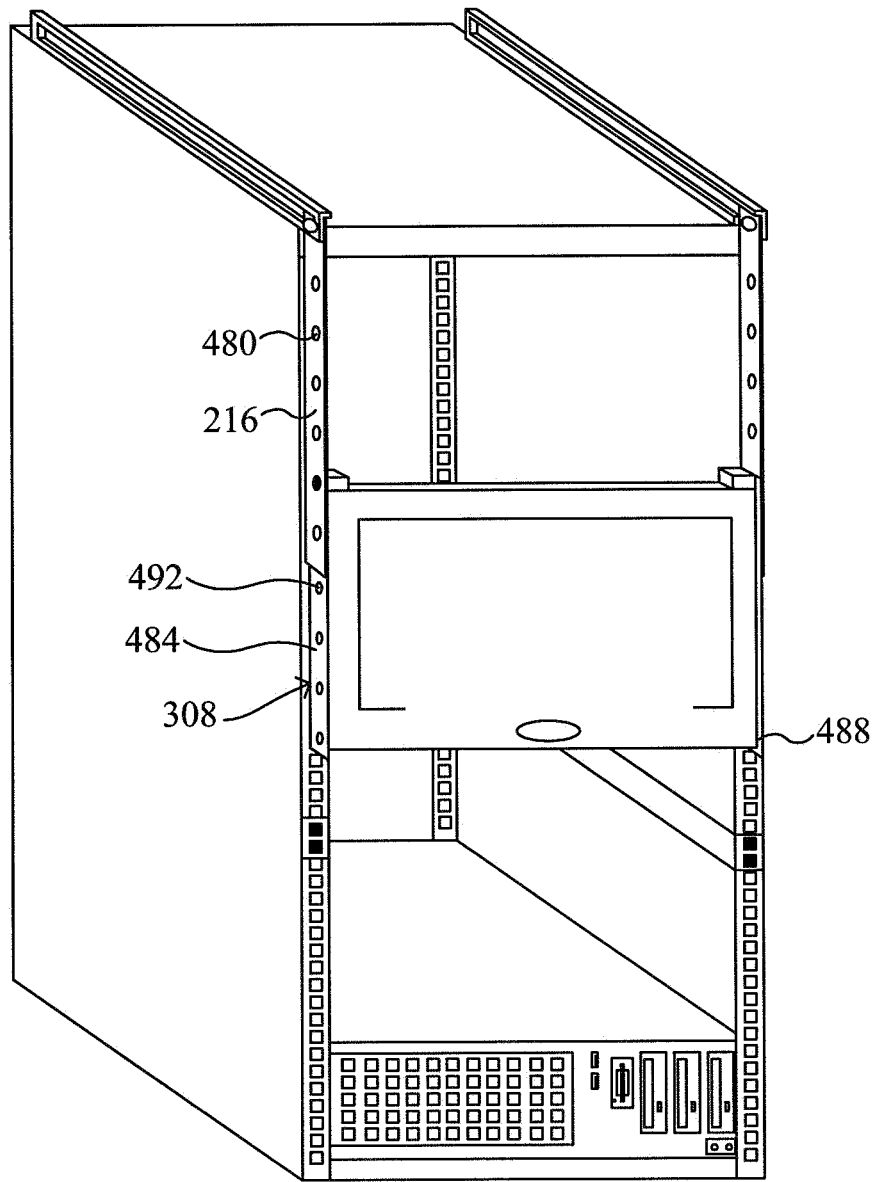
FIG. 4 shows another positional arrangement of the user interaction device in the rack mount system in accordance with an exemplary embodiment.

FIG. 3 and FIG. 4 show exemplary positional arrangements of the user interaction device 132 in the rack mount system 100 in accordance with an exemplary embodiment. As illustrated in FIG. 4, the adjustable mount assembly 200 further may comprise an adjustable frame member 308. The adjustable frame member 308 is coupled to the moving member 249 and is used for holding the user interaction device 132. Further, the adjustable frame member 308 may be adjusted to a desired length. In accordance with an exemplary embodiment, the adjustable frame member 308 may comprise a pair of first frames 216 and a pair of second frames 484 and 488. The pair of first frames 216 are respectively coupled to the pair of wheels of the moving member 249. The user interaction device 132 is attached to the pair of second frames 484 and 488. With the pair of wheels of the moving member 249 slidably moving in the pair of slots 236, the user interaction device 132 with the adjustable frame member 308 slidably moves on the first surface (i.e., top surface) 156 of the cabinet structure 104. The plurality of ball bearings 240 coordinate the motion of the user interaction device 132. That is, via the arrangement of the moving member 249, the support member 208, and the ball bearings 240, the user interaction device 132 slides along the first surface 156. A plurality of adjustment holes 480 are mounted on the pair of first frames 216. Moreover, a plurality of adjustment holes 492 are mounted on the pair of second frames 484 and 488. The adjustment holes 480 are arranged in accordance with predetermined spaces on the pair of first frames 216. Similarly, the adjustment holes 492 are arranged in accordance with predetermined spaces on the pair of second adjustment frames 484 and 488. By using fasteners (not shown), a combination of the adjustment holes 480 and the adjustment holes 492 can be chosen to adjust the length of the adjustable frame member 308 based on the needs of a user. Two exemplary configurations of the adjustable frame member 308 are illustrated in FIG. 3 and FIG. 4.

Referring back to FIGS. 1 and 2, the adjustable mount assembly 200 further may comprise a handle member 172 mounted on the user interaction device 132. In accordance with an exemplary embodiment, the user interaction device 132 may be a flat panel display, and the handle member 172 may be mounted on a front surface of the flat panel display. A user may exert a force on the handle member 172 to cause the moving member 249 to move along the first surface 156 of the cabinet structure 104. When a user exerts a force on the handle member 172, the moving member 249 with the related components slides along the support member 208 in a direction as shown by an arrow 322. After the moving member 249 moves to the location corresponding to the notches 238, the user interaction device 132 substantially slides out of the top wall area of the cabinet structure 104. At this moment, the moving member 249 and the pair of notches 238 cooperatively work so that the moving member 249 is pivotally attached to the support member 208. Specifically, the pair of wheels of the moving member 249 are pivotally attached to the pair of frames of the support member 208 in response to the pair of wheels being engaged with the pair of notches 238.

Once the moving member 249 is pivotally attached to the support member 208, the user can exert a force on the handle member 172 and move the user interaction device 132 in a direction as shown by an arrow 324 until the user interaction device 132 is pivoted to a position parallel to the second surface 168 (as shown in FIGS. 3 and 4).

Further, in accordance with an exemplary embodiment, a buffer mechanism or a buffer member (not shown) may be used to provide a buffer between the cabinet structure 104 and the user interaction device 132. The buffer mechanism or the buffer member may, e.g., be implemented by conventional buffer mechanism or buffer member technologies. The buffer mechanism or buffer member may function to ensure that the user interaction device 132 does not collide with the cabinet structure 104 or other components when the user interaction device 132 is pivotally moved to a position parallel to the second surface 168.

Figure 5:
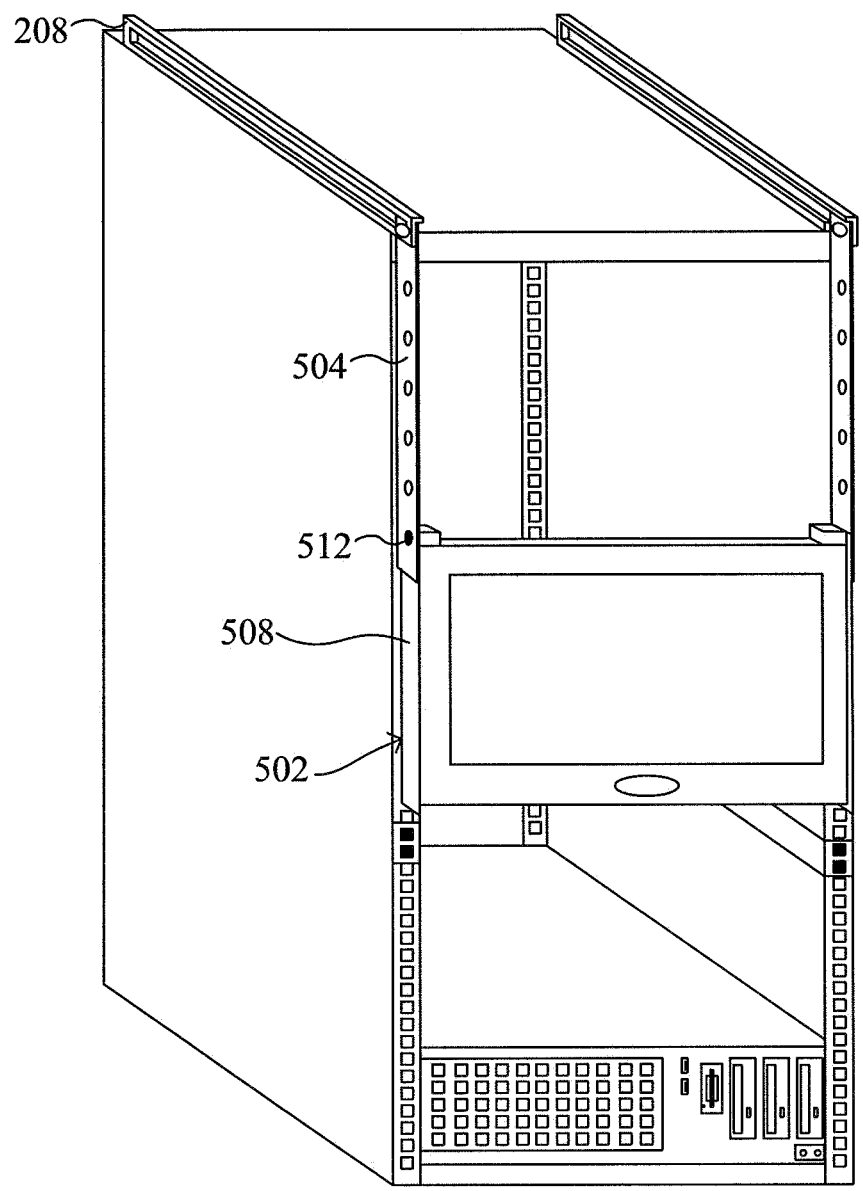
FIG. 5 shows an adjustable mount assembly in accordance with an exemplary embodiment.

Referring to FIG. 5, in accordance with an exemplary embodiment, the adjustable frame member 308 may comprise a pair of two-fold sliding tracks 502, each having a first fold 504 and a second fold 508. The first fold 504 is coupled to the moving member 249, which may include the aforementioned pair of wheels. The user interaction device 132 is attached to the second fold 508. The two-fold sliding tracks may, e.g., be implemented by conventional sliding track technology. With the pair of wheels of the moving member 249 slidably moving in the pair of slots 236, the user interaction device 132 and the pair of two-fold sliding tracks 502 slidably move along the first surface (i.e., top surface) 156 of the cabinet structure 104. A pair of adjustment devices 512, such as a pair of spring bolts, are mounted on the first fold 504 of each of the pair of two-fold sliding tracks 502. After the user interaction device 132 is pivoted to a position parallel to the second surface 168, via the pair of adjustment devices 512, the length of the adjustable frame member 308 is capable of being adjusted via a force exerted by a user. The adjustable frame member 308 is not limited to the pair of two-fold sliding tracks 502. In fact, an N-fold sliding track may be used (N being greater than or equal to 2). The additional N−1 folds may function to provide a way of flexibly adjusting the length of the adjustable frame member 308.

In accordance with the various embodiments described herein, an adjustable mount assembly and a related rack mount system are provided. The various embodiments provide efficient space allocation management, a flexible user interaction device position arrangement, and proper ergonomic design.

Exemplary embodiments have been presented for purposes of illustration and description, but such exemplary embodiments are not intended to be exhaustive or limiting. Many modifications and variations will be apparent to those of ordinary skill in the art. The exemplary embodiments have been chosen and described in order to explain principles and practical application, and to enable others of ordinary skill in the art to understand the disclosure for various embodiments with various modifications as are suited to the particular use contemplated. That is, it is to be understood that the various embodiments are not limited to the described exemplary embodiments, and that various other changes and modifications may be affected therein by one skilled in the art without departing from the scope or spirit of the disclosure.

What is claimed is:

1. A mount assembly for mounting a user interaction device outward from a cabinet structure, wherein said cabinet structure comprises a first surface and a second surface adjacent to said first surface, said assembly comprising:
   a moving member movable substantially horizontally with respect to said first surface;
   a support member fixedly mounted on said first surface, said moving member being slidably mounted thereon;
   an adjustable frame member for mounting said user interaction device, wherein said adjustable frame member is coupled to said moving member, and wherein a length of said adjustable frame member is adjustable substantially with respect to said second surface; and
   a handle member mounted on said user interaction device, wherein by exerting a first force on said handle member, said moving member slides along said support member; wherein by exerting a second force on said handle member, said user interaction device is pivoted to a position parallel to said second surface via said moving member; and wherein by exerting a third force on said handle member, said length of said adjustable frame member is adjusted commensurate with said third force, said third force being exerted while said user interaction device is in a position parallel to said second surface.

2. The assembly of claim 1, wherein said first surface comprises a top surface of said cabinet structure, and said second surface comprises a front surface adjacent to said top surface.

3. The assembly of claim 1, wherein said user interaction device comprises at least one of a monitor, a keyboard, and a mouse; wherein said monitor comprises at least one of a flat display panel, a cathode ray tube display, and a projection display; and wherein said keyboard comprises at least one of a physical keyboard, a virtual keyboard, and a MIDI keyboard.

4. The assembly of claim 1, wherein said cabinet structure is adapted for receiving at least one unit, said at least one unit comprising at least one of a desktop computer, a notebook computer, a server, an article of medical equipment, a high level power supply, and an enterprise level storage system.

5. The assembly of claim 1, wherein said adjustable frame member comprises a two-fold sliding track, said two-fold sliding track comprising a first fold slidably mounted on said first surface and a second fold fixedly holding said user interaction device.

6. The assembly of claim 1, further comprising:
   a ball bearing member retained in said support member for coordinating the motion of said user interaction device in response to said moving member moving on said first surface.

7. The assembly of claim 1, wherein said support member comprises a pair of frames with a pair of slots and a pair of notches respectively at ends of said pair of slots, wherein said moving member comprises a pair of wheels for sliding within said pair of slots, wherein said pair of wheels are pivotally attached to said pair of frames in response to said pair of wheels being engaged with said pair of notches, and wherein said length of said adjustable frame member is adjustable in response to said adjustable frame member being pivoted to a position parallel to said second surface.

8. The assembly of claim 7, wherein said adjustable frame member comprises a pair of first frames and a pair of second frames respectively adjustably coupled to said pair of first frames, wherein said pair of first frames are respectively coupled to said pair of wheels, and wherein said user interaction device is coupled to said pair of second frames.

9. A rack mount system comprising:
   a user interaction device;
   a cabinet structure, wherein said cabinet structure comprises a first surface and a second surface adjacent to said first surface;
   a support member fixedly mounted on said first surface;
   a moving member slidably mounted on said support member, wherein, in response to said moving member being moved from a first end to a second end of said support member, said moving member is pivotally connected to said second end of said support member, and wherein, in response to said moving member being pivotally connected to said second end of said support member, said moving member is pivoted to a position substantially parallel to said second surface; and
   an adjustable frame member for mounting said user interaction device, wherein said adjustable frame member is coupled to said moving member, and wherein a length of said adjustable frame member is adjustable in response to said moving member being pivoted to a position substantially parallel to said second surface.

10. The system of claim 9, wherein said first surface comprises a top surface of said cabinet structure, and wherein said second surface comprises a front surface adjacent to said top surface.

11. The system of claim 9, wherein said user interaction device comprises at least one of a monitor, a keyboard, and a mouse; wherein said monitor comprises at least one of a flat display panel, a cathode ray tube display, and a projection display; wherein said keyboard comprises at least one of a physical keyboard, a virtual keyboard, and a MIDI keyboard; and wherein said cabinet structure is adapted for receiving at least one unit, said at least one unit comprising at least one of a desktop computer, a notebook computer, a server, an article of medical equipment, a high level power supply, and an enterprise level storage system.

12. The system of claim 9, wherein said adjustable frame member comprises a two-fold sliding track, wherein said two-fold sliding track comprises a first fold slidably mounted on said first surface and a second fold fixedly holding said user interaction device.

13. The system of claim 10, further comprising a handle member mounted on said user interaction device, wherein by exerting a first force on said handle member, said moving member slides along said support member; wherein by exerting a second force on said handle member, said user interaction device is pivoted to a position substantially parallel to said second surface via said moving member; and wherein by exerting a third force on said handle member, said length of said adjustable frame member is adjusted commensurate with said third force.

14. The system of claim 9, wherein said support member comprises a pair of frames with a pair of slots and a pair of notches respectively at ends of said pair of slots, wherein said moving member comprises a pair of wheels for sliding within said pair of slots, wherein said pair of wheels are pivotally attached to said pair of frames in response to said pair of wheels being engaged with said pair of notches, and wherein said length of said adjustable frame member is adjustable in response to said adjustable frame member being pivoted to a position substantially parallel to said second surface.

15. A mount assembly for a rectangularly configured structure, wherein said structure comprises a first surface and a second surface adjacent to said first surface, said assembly comprising:
- a support member fixedly mounted on said first surface;
- a moving member slidably mounted on said support member, wherein, in response to said moving member being moved from a first end to a second end of said support member, said moving member is pivotally connected to said second end of said support member, and wherein, in response to said moving member being pivotally connected to said second end of said support member, said moving member is pivoted to a position substantially parallel to said second surface; and
- an adjustable frame member coupled to said moving member, wherein a length of said adjustable frame member is adjustable in response to said moving member being pivoted to a position substantially parallel to said second surface.

16. The assembly of claim 15, wherein said structure comprises four vertical supports defining a top surface and a front surface, wherein said first surface comprises said top surface, and wherein said second surface comprises said front surface.

17. The assembly of claim 15, further comprising a user interaction device, wherein said user interaction device comprises at least one of a monitor, a keyboard, and a mouse; wherein said monitor comprises at least one of a flat display panel, a cathode ray tube display, and a projection display; wherein said keyboard comprises at least one of a physical keyboard, a virtual keyboard, and a MIDI keyboard; and wherein said structure is adapted for receiving at least one unit, said at least one unit comprising at least one of a desktop computer, a notebook computer, a server, an article of medical equipment, a high level power supply, and an enterprise level storage system.

18. The assembly of claim 15, wherein said adjustable frame member comprises a two-fold sliding track, wherein said two-fold sliding track comprises a first fold slidably mounted on said first surface and a second fold fixedly holding said user interaction device.

19. The assembly of claim 17, further comprising a handle member mounted on said user interaction device, wherein by exerting a first force on said handle member, said moving member slides along said support member; wherein by exerting a second force on said handle member, said user interaction device is pivoted to a position substantially parallel to said second surface via said moving member; and wherein by exerting a third force on said handle member, said length of said adjustable frame member is adjusted commensurate with said third force.

20. The assembly of claim 15, wherein said support member comprises a pair of frames with a pair of slots and a pair of notches respectively at ends of said pair of slots, wherein said moving member comprises a pair of wheels for sliding within said pair of slots, wherein said pair of wheels are pivotally attached to said pair of frames in response to said pair of wheels being engaged with said pair of notches, and wherein said length of said adjustable frame member is adjustable in response to said adjustable frame member being pivoted to a position substantially parallel to said second surface.

* * * * *